United States Patent [19]
Pedersen

[11] 3,866,066
[45] Feb. 11, 1975

[54] POWER SUPPLY DISTRIBUTION FOR INTEGRATED CIRCUITS

[75] Inventor: Richard Alan Pedersen, Allentown, Pa.

[73] Assignee: Bell Telephone Laboratories, Incorporated, Murray Hill, N.J.

[22] Filed: July 16, 1973

[21] Appl. No.: 379,259

[52] U.S. Cl. ................. 307/297, 307/213, 307/296, 307/303, 357/36, 357/44, 357/46, 357/48
[51] Int. Cl. ............................................ H01l 19/00
[58] Field of Search ................. 317/234 UA, 235 E; 307/213, 296, 297, 303; 357/48, 36, 44, 46

[56] References Cited

UNITED STATES PATENTS

| | | | |
|---|---|---|---|
| 3,340,404 | 9/1967 | Willems et al. | 307/297 |
| 3,423,650 | 1/1969 | Cohen | 317/235 E |
| 3,525,020 | 8/1970 | Schmitz | 317/235 E |
| 3,532,909 | 10/1970 | Buckley | 307/213 |
| 3,538,397 | 11/1970 | Davis | 317/234 UA |
| 3,560,277 | 2/1971 | Lloyd et al. | 317/234 UA |
| 3,579,059 | 5/1971 | Widlar | 317/235 Y |
| 3,581,165 | 5/1971 | Seelbach et al. | 317/234 UA |
| 3,617,778 | 11/1971 | Korom | 307/213 |
| 3,656,028 | 4/1972 | Langdon | 317/235 E |
| 3,657,612 | 4/1972 | Wiedmann | 317/235 Y |
| 3,694,762 | 9/1972 | Mulder | 317/235 Y |
| 3,736,477 | 5/1973 | Berger et al. | 357/44 |
| 3,823,353 | 7/1974 | Berger et al. | 357/44 |

OTHER PUBLICATIONS

H. C. Lin, Integrated Electronics (San Francisco, Holden-Day, Pub.), 1967, pages 270–271.

S. F. Colaco, "The Ferranti CDI Process . . . ," paper No. 30/2, 1973 IEEE Intercon., N.Y., presented Mar. 28, 1973 (published copies distributed by mail Apr. 5, 1973).

Hibberd, Integrated Circuits (TI electronics series), McGraw-Hill, N.Y., 1969, pp. 40, 79, 80, 135.

*Primary Examiner*—Andrew J. James
*Assistant Examiner*—William D. Larkins
*Attorney, Agent, or Firm*—Donnie E. Snedeker

[57] ABSTRACT

A first supply potential, $V_{EE}$, is distributed to various components in an illustrative p-type substrate integrated circuit via a set of distribution devices, illustratively pnp transistors. In particular, a plurality of p-type regions diffused in an n-type isolation island at desired potential distribution points function as the distribution transistor emitters. The region of the island below each emitter functions as a base, and the region of the substrate below each base functions as a collector. The substrate and the bulk n-type portion of the isolation island are connected to $V_{EE}$. A uniform potential one emitter-base drop above $V_{EE}$ is thus provided at each emitter. The latter is connected to a nearby circuit component via a short metallization path.

Similarly, $V_{CC}$ is distributed to components in the integrated circuit via a set of npn distribution transistors located in a second isolation island.

13 Claims, 5 Drawing Figures

POWER SUPPLY DISTRIBUTION FOR INTEGRATED CIRCUITS

BACKGROUND OF THE INVENTION

The present invention relates to semiconductor integrated circuits and, more particularly, to arrangements for distributing power supply potentials in them.

One of the important design considerations in the fabrication of medium- and large-scale semiconductor integrated structures is distribution of power supply potentials to various circuit components in the chip. At the present time, power supply potential distribution is usually provided by metallization paths deposited on the surface of the chip. However, the use of metallization paths generally increases chip area, design difficulty and crossover problems.

One prior art approach to distributing a supply potential internal to the body of the chip rather than externally via metallization paths is to distribute the potential through a substrate layer with taps being provided from the substrate to the various circuit components. Such arrangements are generally unsatisfactory because the conductivity of integrated circuit substrates is relatively low (typically 10 ohm-cm) and the variation in potential from one tap to the next due to voltage drops in the substrate may be unacceptably large.

Increasing the substrate conductivity to minimize this variation creates a new set of problems. These include increased capacitance at the junction of the substrate and the adjacent layer, and decreased junction breakdown voltage. This, of course, limits the useful frequency and voltage ranges of the integrated circuit. Moreover, as the doping level of the substrate is increased to increase its conductivity, auto-doping of the adjacent layer becomes a problem as impurities from the substrate cross over and contaminate the layer.

Other more complex internal supply potential distribution arrangements have been devised to avoid the above problems. However, these arrangements generally introduce additional or nonstandard steps into the integrated circuit manufacturing process including, for example, multiple epitaxial growths and extra $n^+$, $p^+$ and *p* layers, thereby increasing the cost and complexity of integrated circuit manufacture.

SUMMARY OF THE INVENTION

The principal objects of the present invention, therefore, are to provide an improved integrated circuit supply potential distribution system which:

provides a substantially uniform potential at each supply potential distribution point;

utilizes standard conductivities in the various regions of the chip;

requires a minimum of metallization; and introduces no additional or nonstandard steps into the integrated circuit manufacturing process.

These and other objects of the invention are achieved by providing, at each desired distribution point, a supply potential distribution device, having an input terminal, an output terminal and a common terminal. The supply potential source is connected to the input terminal of each distribution device via a path which is internal to the body of the chip. A uniform potential is thus provided at the common terminal of each distribution device. That terminal is, in turn, connected to nearby circuitry, illustratively via a short metallization path. In accordance with an aspect of the invention, each distribution device preferably has substantially a pentode-type output characteristic, as discussed more fully hereinbelow.

An illustrative embodiment of the invention distributes power supply potential in a semiconductor integrated circuit having a substrate of a first conductivity type and an adjacent layer of a second conductivity type. A supply potential distribution isolation island is formed in the layer, which latter may be epitaxially grown, for example. The island extends adjacent a plurality of circuit components in the chip to which the supply potential is to be distributed. A plurality of regions of the first conductivity type are provided in the distribution island, each at a different desired distribution point. There is thus provided a set of distribution devices, specifically transistors, for distributing a first supply potential, illustratively $V_{EE}$. Each first conductivity region functions as the emitter of one of the distribution transistors, while the region of the distribution island below that functions as the base of that transistor and the region of the substrate below that as the collector. The $V_{EE}$ supply is connected to the bulk n-type portion of the distribution island, and thus via the distribution island to the base of each distribution transistor. A source of potential, which may be the $V_{EE}$ supply or another supply distinct from it, is connected to the substrate, and thus via the substrate to the collector of each distribution transistor. A path through the substrate is thereby provided for the distribution transistor collector currents.

The relatively large magnitude of the distribution transistor collector currents coupled with the relatively low conductivity of the substrate, results in distribution transistor collector potentials which vary with distance from the $V_{EE}$ supply. As mentioned above, this nonuniform voltage loss in the substrate is a problem in prior art arrangements which seek to distribute power supply potentials through the substrate directly. However, in the present arrangement, only very small currents flow in the distribution island because most of each distribution transistor's current flows between its emitter and collector, and little current flows via the base. Thus the base of each distribution transistor is substantially at $V_{EE}$ and, advantageously, a uniform potential of one emitter-base drop above $V_{EE}$ is provided at each distribution transistor emitter. The above-discussed variation in collector potential from one distribution transistor to the other is compensated for by the fact that a transistor has substantially a pentode-type output characteristic, by which it is meant that a given current level, the emitter-collector voltage of a transistor can take on a range of values in its active region and in soft saturation.

Distribution for a second supply potential, illustratively $V_{CC}$, is provided via a second set of distribution devices, again illustratively transistors, located in a second distribution isolation island. A zone of the first conductivity type extending substantially the length of the second distribution island is provided therein, and a plurality of regions of the second conductivity type are provided in the zone. Each of the last-mentioned regions functions as the emitter of a distribution transistor for $V_{CC}$. The region of the zone below that functions as the base, and the region of the distribution island below that as the collector. The $V_{CC}$ supply is connected to the bulk p-type portion of the zone so that again a uniform potential is provided at each distribution transistor emitter. A source of potential is also connected to the bulk n-type portion of the distribution island, thereby providing a path through the island for the distribution transistor collector currents.

As indicated above, the supply connected to the distribution transistor bases in either the $V_{EE}$ or $V_{CC}$ distribution systems, may also be the supply which is connected to their collectors. However, in accordance with an aspect of the invention, the bases and collectors may be connected to distinct sources. It is then possible for the base source, from which the potential to be distributed is provided, to advantageously include a low current voltage regulator which is part of the integrated circuit itself. The collector supply may then be an unregulated external supply. The need for a high current voltage regulator is thereby obviated.

BRIEF DESCRIPTION OF THE DRAWING

A clear understanding of the invention may be gained from a consideration of the following detailed description and accompanying drawing, in which.

DETAILED DESCRIPTION

The semiconductor integrated circuit of FIGS. 1–4 is fabricated illustratively on a p-type substrate 10, using conventional fabrication techniques. As depicted by way of example, a plurality of $p^+$-type isolation diffusions divide an n-type epitaxial layer formed over substrate 10 into a number of isolation islands, including islands 20 and 80 (shown in breakaway view in FIG. 1) and islands 50. A first power supply potential, $V_{EE}$, and a second, more positive power supply potential, $V_{CC}$, are distributed in accordance with the invention to circuit components located in islands 20, 50 and 80, as fully described hereinafter.

Figure 5:
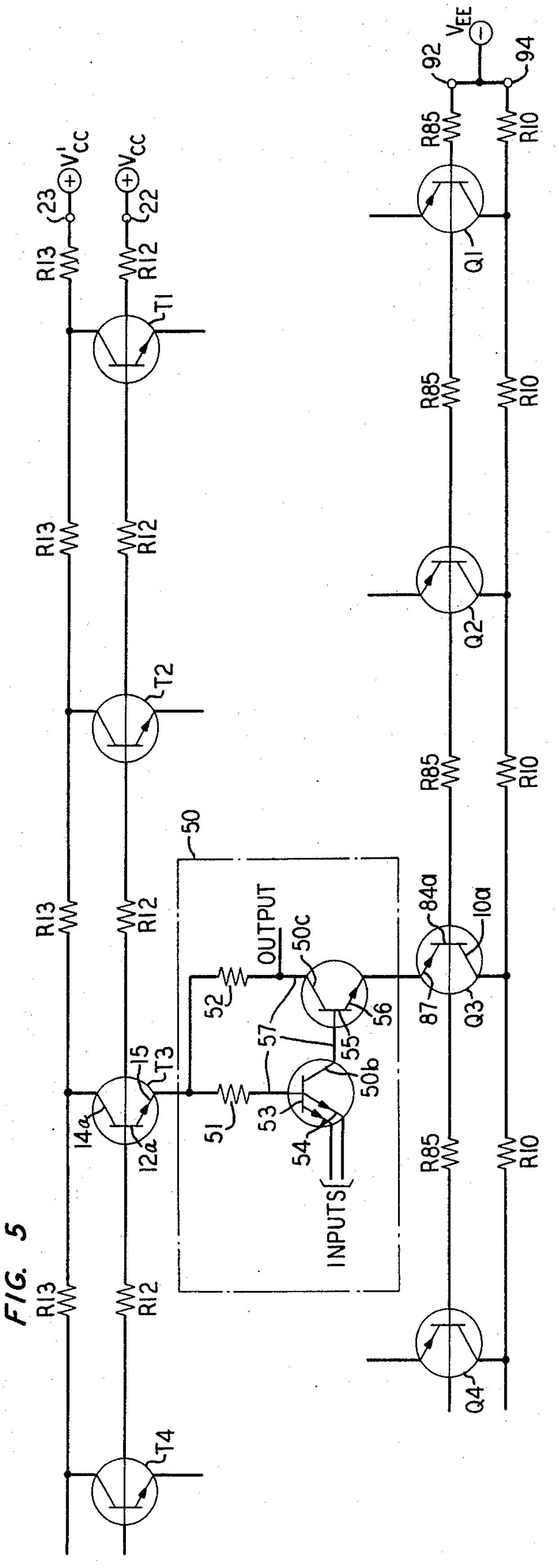
FIG. 5 is a schematic representation of the integrated circuit of FIG. 1.

Further by way of example, one of isolation islands 50 is shown as comprising three smaller islands **50*a*, 50*b* and 50*c*, each of which includes one or more circuit components. These circuit components are interconnected to form a logic gate shown schematically in FIG. 5. Island 50*a* includes a pair of p-type resistors 51 and 52 which are connected to each other at one end. Island 50*b* includes a double-emitter, npn transistor having island 50*b* as the collector, p-type base 53 and n-type emitters 54. Island 50*c* includes an npn transistor having island 50*c* as the collector, p-type base 55 and n-type emitter 56. These various components are interconnected via metallization paths 57 to form a logic gate having inputs at emitters 54 and an output at collector 50*c*. For the sake of clarity, no circuitry is shown in the other islands 50 or in islands 20 and 80.** However, it will be appreciated that each island may include any desired combination of circuit components to which power supply potential is to be distributed, and that various metallization paths or other interconnecting arrangements (not shown) may interconnect such components. Since the present potential distribution system requires very little metallization, crossover problems attendant to interconnection of components on one island and components on another are advantageously minimized.

In accordance with the invention, power supply potentials are distributed to components in circuits such as the above-described logic gate by means of power supply potential distribution devices located in n-type distribution islands 14 and 84. These devices advantageously have substantially pentode-type output characteristics and are illustratively transistors. Sections of islands 14 and 84 function as resistive paths connecting the distribution transistors to the power supplies.

Figure 1:
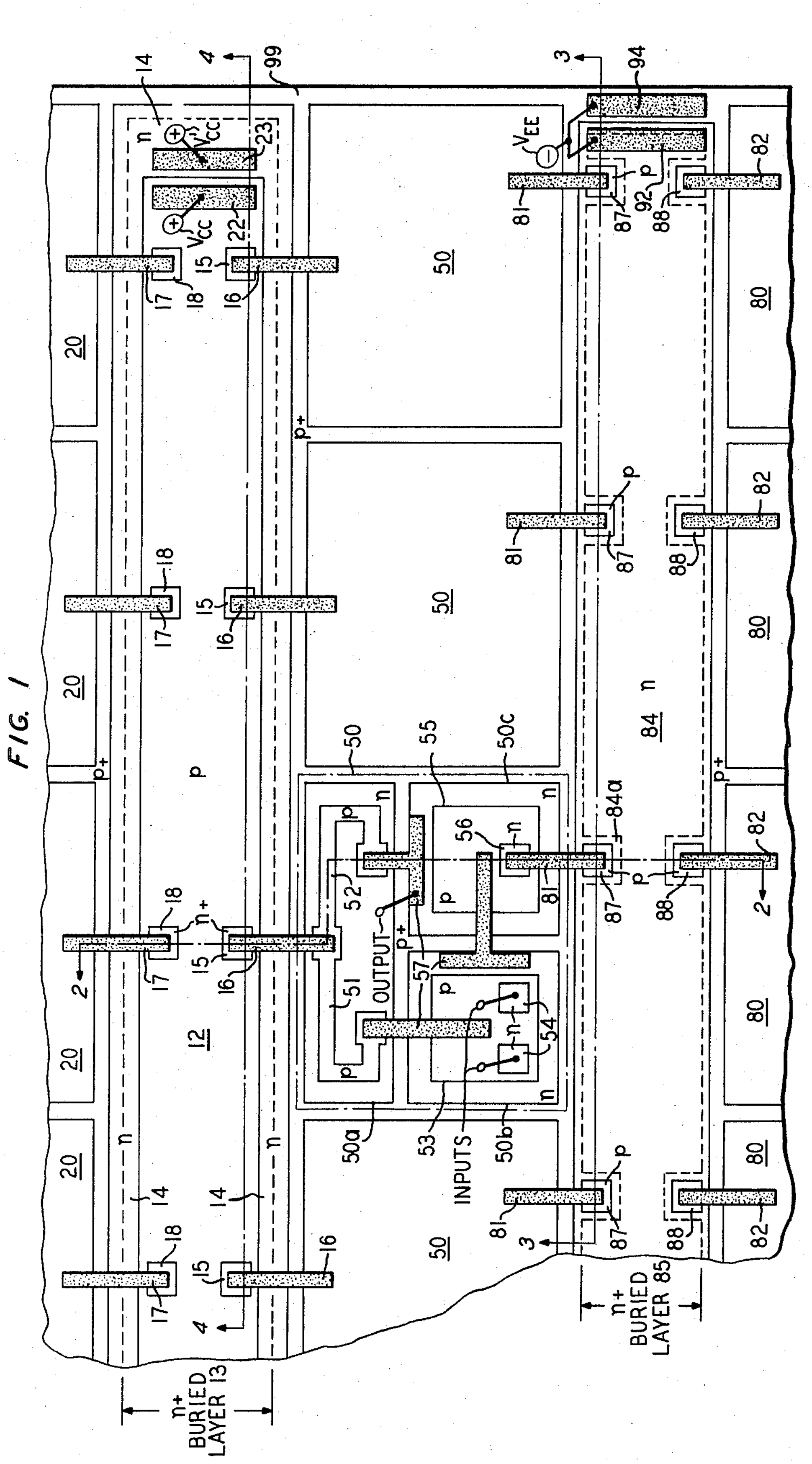
FIG. 1 is a topographical view of an illustrative semiconductor integrated circuit including a power supply potential distribution arrangement in accordance with the present invention.
Figure 2:
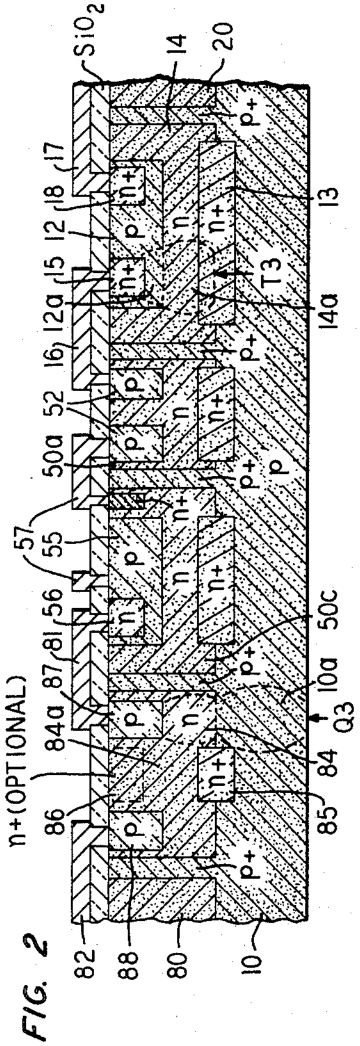
FIGS. 2, 3 and 4 are sectional views of the integrated circuit of FIG. 1 taken along section lines 2—2, 3—3 and 4—4, respectively.
Figure 3:
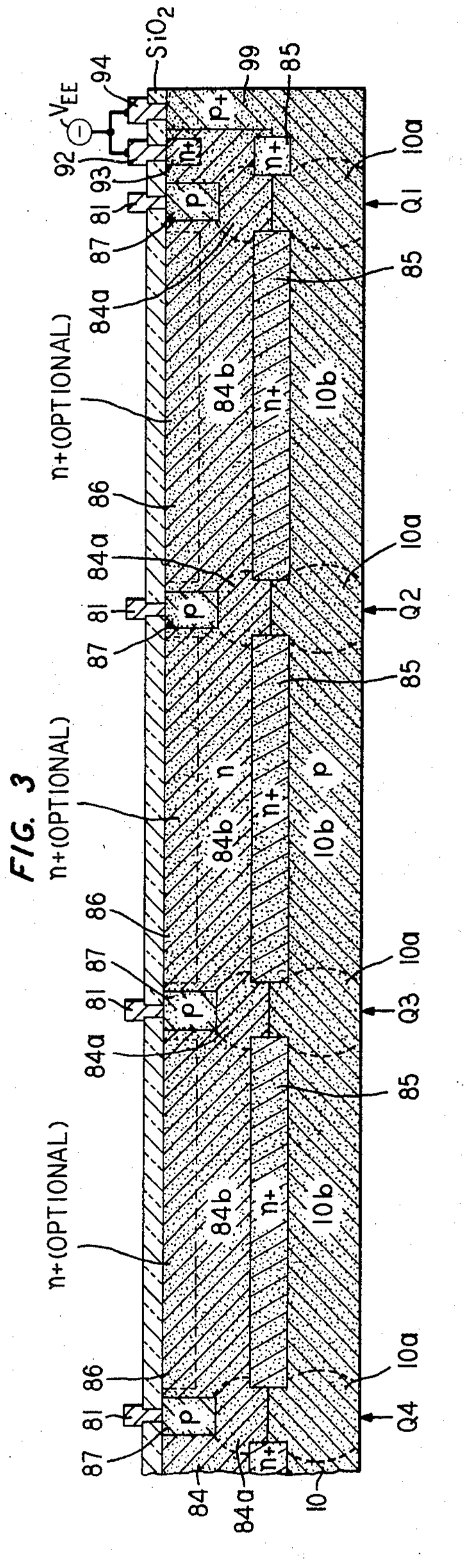
Figure 4:
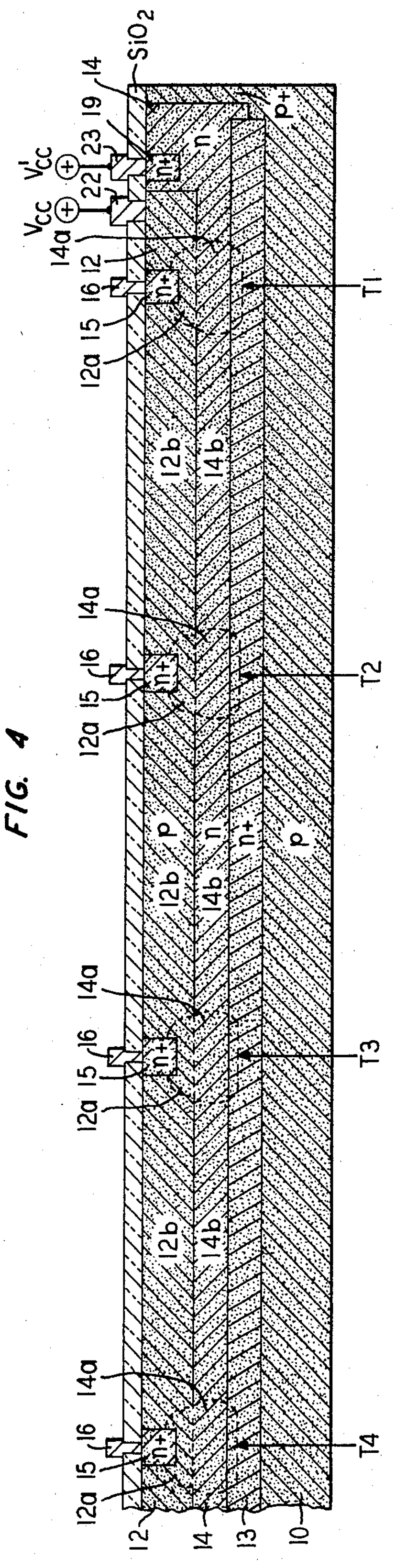

In particular, distribution of $V_{EE}$ to components in islands 50 and 80 is provided via island 84. A first set of p-type regions 87 are provided in island 84 during, for example, the standard base diffusion step. There is thus provided in island 84 a first set of pnp transistors Q1, Q2, et cetera, which, it will be appreciated, are parasitic multilayer devices. Each p-type region 87 functions as the emitter portion of one of transistors Q1, Q2, et cetera. The region **84*a* of n-type island 84 below the emitter portion functions as the base portion, and the region 10*a* of p-type substrate 10 below that functions as the collector portion. It will be appreciated that regions 84*a* and 10*a* are not physically distinct regions of island 84 and substrate 10, respectively, and that the dashed lines indicating regions 84*a* and 10*a* in FIGS. 2–4 are provided to suggest the approximate dimensions of the base and collector portions, respectively, of transistors Q1, Q2,** et cetera.

Each neighboring pair of collector regions **10*a* is interconnected by a resistance comprising a section 10*b* of substrate 10. These interconnecting resistances are indicated by R10 in FIG. 5. Each neighboring pair of base regions 84*a* is interconnected by a resistance comprising the parallel combination of a section 84*b* of island 84 and a section of $n^+$ buried layer 85. The resistivity of layer 85 principally determines the effective magnitude of these base interconnecting resistances, which resistances are thus indicated by R95 in FIG. 5.**

The bulk n-type portion of island 84 is connected via $n^+$ region 93 to a first supply potential point, illustratively contact pad 92. The latter is connected to the $V_{EE}$ supply. Substrate 10 is connected via $p^+$ isolation diffusion 99 to a second supply potential point, illustratively contact pad 94. Contact pad 94 is also illustratively connected to $V_{EE}$. However if desired, contact pad 94 may be connected to a source distinct from $V_{EE}$. This aspect of the invention is discussed more fully hereinafter in conjunction with the $V_{CC}$ distribution system.

Each emitter 87 is connected to a circuit component or components in a nearby one of islands 50 via a metallization path 81. Thus emitter 87 of transistor Q3, for example, is connected to emitter 56.

Island 84 (including buried layer 85) is substantially zero biased with respect to substrate 10. Thus negligible current flows between them and substantially all the base current from each distribution transistor Q1, Q2, et cetera, flows to $V_{EE}$ through a series of the resistance R85. Similarly, the collector current of each distribution transistor Q1, Q2, et cetera, flows to $V_{EE}$ through a series of the resistances R10.

The current through each resistance R85 is the sum of the base currents of all the distribution transistors to its left. Nonetheless, the voltage drops across each resistance R85 may be regarded as zero because almost all of each distribution transistor's emitter current flows to its collector, and only a very small fraction thereof flows to its base. The base potential of each distribution transistor may thus be regarded as being substantially at $V_{EE}$. Where desired, the magnitude of resistances R85 can be lowered to further assure minimal voltage drop thereacross by diffusing into island 84 an $n^+$ region 86 indicated in dashed outline in FIGS. 2 and 3. Region 86 may extend to any desired depth down to buried layer 85.

The current through each resistance R10 is the sum of the collector currents of all the distribution transistors to its left. The distribution transistor collector currents are relatively large. Moreover, the conductivity of substrate 10 is kept relatively low to minimize junction capacitances, maximize breakdown voltages, et cetera. Thus, the collector potentials of distribution transistors Q1, Q2, et cetera, vary from one transistor to the next. However, as long as these transistors are kept out of deep saturation, their emitters are all at a potential substantially equal to one emitter-base drop above $V_{EE}$ because a transistor has substantially a pentode-type output characteristic. Thus a transistor operates very much like a current source in its active region and in soft saturation, and for a given current through the transistor, the emitter-collector voltage can take on a range of values. Thus, each distribution transistor Q1, Q2, et cetera, is able to take on an emitter-collector voltage which compensates for the difference between its collector potential and that of the other distribution transistors.

In accordance with the foregoing, the magnitude of resistances R10 must be small enough to ensure that each distribution transistor is kept out of deep saturation. Advantageously, the various design parameters of the present distribution system can be chosen such that the conductivity of substrate 10 necessary to ensure that resistance R10 are sufficiently small is no greater than standard substrate conductivity, typically 10 ohm-cm. Thus, unlike the prior art, the present invention advantageously provides uniform internal supply potential distribution without sacrificing low junction capacitance, high breakdown voltages and other desirable integrated circuit characteristics.

The loss of (nominally) 0.6 volt across the emitter-base junction of transistors Q1, Q2, et cetera, is not necessarily disadvantageous. In fact, this voltage shift is often designed into the arrangement in any case (for example, via a diode inserted in the supply current path) so that the voltage provided will be compatible with conventional TTL gate structures. Where this voltage shift is not required, it can nevertheless usually be accommodated by adjusting other circuit parameters.

In like manner, distribution of $V_{EE}$ to circuit components in islands 80 is provided by a second set of distribution transistors each having, for example, an emitter 88 located in island 84. Each emitter 88 is connected to circuitry in one of islands 80 via a metallization path 82.

The second supply potential, $V_{CC}$, is distributed to circuit components in islands 20 and 50 via distribution devices comprising npn transistors T1, T2, et cetera, located in island 14. More particularly, n-type island 14 has provided therein a p-type zone 12. Zone 12, which may be diffused during, for example, the standard base diffusion step, extends substantially the length of island 14. A first set of $n^+$-type regions 15 are provided in p-type zone 12 during, for example, the standard emitter diffusion step. Each $n^+$-type region 15 functions as the emitter portion of one of npn distribution transistors T1, T2, et cetera. The region 12*a* of p-type zone 12 below each region 15 functions as the base portion, and the region 14*a* of island 14 below each region 12*a* functions as the collector portion.

Each neighboring pair of base regions 12*a* is interconnected by a resistance comprising a section 12*b* of zone 12. These interconnecting resistances are indicated by R12 in FIG. 5. Each neighboring pair of collector regions 14*a* is interconnected by a resistance comprising the parallel combination of a section 14*b* of island 14 and a section of $n^+$ buried layer 13. The resistivity of buried layer 13 principally determines the effective magnitude of the collector interconnecting resistances, which are thus indicated by R13 in FIG. 5.

The bulk p-type portion of zone 12 is connected to a first supply potential point, illustratively contact pad 22, while the bulk n-type portion of island 14 is connected via $n^+$ region 19 to a second supply potential point, illustratively contact pad 23. In accordance with an aspect of the invention, contact pads 22 and 23 are connected to separate supplies, $V_{CC}$ and $V'_{CC}$, respectively, the magnitude of the latter being at least as great as that of the former.

The current through the $V_{CC}$ supply is the sum of the base currents of transistors T1, T2, et cetera. Since this current is relatively small, the $V_{CC}$ supply may advantageously include a low current voltage regulator located in the integrated circuit itself. The $V'_{CC}$ supply, through which most of the current in the chip flows, may then be an unregulated external supply. The invention thus obviates the need for a high current voltage regulator.

Of course it will be appreciated that the $V_{EE}$ or $V_{CC}$ distribution systems may each comprise either a one source arrangement, as per the present illustrative $V_{EE}$ system, or a two source arrangement, as per the present illustrative $V_{CC}$ system.

Each emitter 15 is connected to circuitry in a nearby one of islands 50 via metallization path 16. Thus emitter 15 of transistor T3, for example, is connected to the junction of resistors 51 and 52. The $V_{CC}$ distribution system operates in a similar manner to the $V_{EE}$ system, as described above. The magnitudes of resistances R12 and R13 can be set to desired values by proper choice of dimensions and conductivities of zone 12, buried layer 13 and island 14.

Distribution of $V_{CC}$ to circuit components in islands 20 is provided in similar manner by a second set of distribution transistors in island 14 each having, for example, a diffused emitter 18. Each of the latter is connected to circuitry in one of islands 20 via a metallization path 17.

It will be appreciated that $V_{EE}$ and $V_{CC}$ can be distributed to islands 20 and 80, respectively, via distribution islands (not shown) similar to islands 84 and 14. In general, an integrated circuit chip may include as many $V_{CC}$ and $V_{EE}$ distribution islands as the particular chip layout requires. In some cases, only one of these power supply potentials might be distributed in accordance with the invention, the other being distributed via a metallization path, or other known arrangement.

The present invention has been described hereinabove in conjunction with an illustrative circuit fabricated in accordance with a particular known integrated circuit technology. That technology utilizes, for example, epitaxial growth, buried layers and p-n junction isolation. However, it will be apparent to those skilled in the art that the invention is in no way limited in its application to any particular type of integrated circuit structure or fabrication technology. Rather, the invention can be implemented readily in many types of integrated circuits produced in accordance with various fabrication techniques and processes. Thus it will be appreciated that variations of the invention and modifications thereto may be devised by those skilled in the art without departing from the spirit and scope of the principles of the invention.

I claim:

1. An arrangement for distributing a predetermined potential to individual components in an integrated circuit comprising a body of semiconductive material, said arrangement comprising means internal to said body of semiconductive material for connecting each of said components to a source substantially at said potential; said arrangement characterized by a plurality of distribution devices each having a first terminal, a second terminal, a third terminal, a p-n junction disposed between said first and third terminals and a current path between said second and third terminals; first means internal to said body of semiconductive material for connecting the first terminal of each of said devices to a first supply potential point, said point being adapted for connection to said source; means including said first means for forward biasing said p-n junction; and means for connecting the third terminal of each of said devices to at least one of said components, whereby current for each of said components is provided via said current path of a respective one of said devices.

2. The arrangement of claim 1 wherein said integrated circuit includes a substrate of a first conductivity type and an isolation island of a second conductivity type adjacent said substrate, and wherein said first connecting means comprises said island.

3. The arrangement of claim 2 further comprising second means for connecting the second terminal of each of said devices to a second supply potential point, said second connecting means comprising said substrate.

4. An arrangement for distributing a predetermined potential to individual components in an integrated circuit comprising a body of semiconductive material, said integrated circuit including a substrate of a first conductivity type and an isolation island of a second conductivity type adjacent said substrate, said arrangement comprising means internal to said body of semiconductive material for connecting each of said components to a source substantially at said potential, said arrangement characterized by a plurality of distribution devices each having a first terminal, a second terminal and a third terminal, said third terminal of each of said devices comprising a region of said first conductivity type located in said island, said first terminal of each of said devices comprising a region of said island located adjacent said first conductivity type region so as to form a p-n junction between said regions, and said second terminal of each of said devices comprising a region of said substrate adjacent said island region, first means including said island for connecting the first terminal of each of said devices to a first supply potential point, said point being adapted for connection to said source, second means including said substrate for connecting the second terminal of each of said devices to a second supply potential point, means including said first means for forward biasing said p-n junction and means for connecting the third terminal of each of said devices to at least one of said components.

5. The arrangement of claim 1 wherein said integrated circuit includes a substrate of a first conductivity type, an isolation island of a second conductivity type adjacent said substrate and a zone of said first conductivity type located in said island, and wherein said first connecting means comprising said zone.

6. The arrangement of claim 5 further comprising second means for connecting the second terminal of each of said devices to a second supply potential point, said second connecting means comprising said island.

7. An arrangement for distributing a predetermined potential to individual components in an integrated circuit comprising a body of semiconductive material, said integrated circuit including a substrate of a first conductivity type, an isolation island of a second conductivity type adjacent said substrate and a zone of said first conductivity type located in said island, said arrangement comprising means internal to said body of semiconductive material for connecting each of said components to a source substantially at said potential, said arrangement characterized by a plurality of distribution devices each having a first terminal, a second terminal and a third terminal, said third terminal of each of said devices comprising a region of said second conductivity type located in said zone, said first terminal of each of said devices comprising a region of said zone located adjacent said second conductivity type region so as to form a p-n junction between said regions, and said second terminal of each of said devices comprising a region of said island adjacent said zone region, first means including said zone for connecting the first terminal of each of said devices to a first supply potential point, said point being adapted for connection to said source.

second means including said island for connecting the second-terminal of each of said devices to a second supply potential point, means including said first means for forward biasing said p-n junction and means for connecting the third terminal of each of said devices to at least one of said components.

8. In an integrated circuit having a substrate of a first conductivity type, a layer of a second conductivity type adjacent said substrate, and at least a first isolation island formed in said layer, an arrangement for distributing a predetermined potential to each of a plurality of components in said integrated circuit, said arrangement comprising a plurality of transistors having as the bases thereof respective regions of said island and as the emitters thereof respective regions of said first conductivity type located adjacent a respective one of said island regions so as to form a p-n junction between each of said island regions and the adjacent first conductivity type region, impedance means including at least a first section of said island for connecting each of said bases to a source substantially at said potential and for thereby forward biasing said p-n junction, and means for connecting the emitter of each of said transistors to at least one of said components.

9. The arrangement of claim 8 wherein each said transistor has as the collector thereof a region of said substrate adjacent said island region, said arrangement further comprising impedance means including at least a first section of said substrate for connecting each said collector to a source of potential.

10. In an integrated circuit having a substrate of a first conductivity type, a layer of a second conductivity type adjacent said substrate, and at least a first isolation island formed in said layer, an arrangement for distributing a predetermined potential to each of a plurality of components in said integrated circuit, said arrangement comprising a zone of said first conductivity type located in said island, a plurality of transistors having as the bases thereof respective regions of said zone and as the emitters thereof respective regions of said second conductivity type located adjacent a respective one of said zone regions so as to form a p-n junction between each of said zone regions and the adjacent second conductivity type region, impedance means including at least a first section of said zone for connecting each of said bases to a source substantially at said potential and for thereby forward biasing said p-n junction, and means for connecting the emitter of each of said transistors to at least one of said components.

11. The arrangement of claim 10 wherein each said transistor has as the collector thereof a region of said island adjacent said zone region, said arrangement further comprising impedance means including at least a first section of said island for connecting each said collector to a source of potential.

12. In an integrated circuit having a substrate of a first conductivity type, a layer of a second conductivity type adjacent said substrate, a plurality of components to which a predetermined potential is to be distributed, and at least a first isolation island formed in said layer a plurality of regions of said first conductivity type located in said isolation island so as to form a semiconductor junction between each of said regions and said island, means for connecting said island to a first supply potential point and for thereby forward biasing each said semiconductor junction, means for connecting said substrate to a second supply potential point, and, means for connecting individual ones of said regions to individual ones of said components.

13. In an integrated circuit having a substrate of a first conductivity type, a layer of a second conductivity type adjacent said substrate, a plurality of components to which a predetermined potential is to be distributed, at least a first isolation island formed in said layer, and a zone of said first conductivity type located in said island; a plurality of regions of said second conductivity type located in said zone so as to form a semiconductor junction between each of said regions and said zone, means for connecting said zone to a first supply potential point and for thereby forward biasing each said semiconductor junction, means for connecting said island to a second supply potential point, and means for connecting individual ones of said regions to individual ones of said components.

* * * * *

UNITED STATES PATENT OFFICE

CERTIFICATE OF CORRECTION

PATENT NO. : 3,866,066

DATED : February 11, 1975

INVENTOR(S) : Richard A. Pedersen

It is certified that error appears in the above-identified patent and that said Letters Patent are hereby corrected as shown below:

Col. 2, Line 51, after "that" and before "a" insert --at--.

Col. 4, Line 41, "R95" should read --R85--;

Line 61, "resistance" should read --resistances--.

Col. 5, Line 39, "resistance" should read --resistances--.

Col. 8, Line 17, "comprising" should read --comprises--.

Signed and Sealed this

*seventeenth* Day of *February 1976*

[SEAL]

*Attest:*

RUTH C. MASON
*Attesting Officer*

C. MARSHALL DANN
*Commissioner of Patents and Trademarks*